(12) United States Patent
Barton et al.

(10) Patent No.: US 8,368,385 B2
(45) Date of Patent: Feb. 5, 2013

(54) METHODS AND SYSTEMS TO DETECT VOLTAGE CHANGES WITHIN INTEGRATED CIRCUITS

(75) Inventors: Aaron M. Barton, Erie, CO (US); James S. Ignowski, Fort Collins, CO (US); Pablo Lopez, Fort Collins, CO (US); Mondira Pant, Westborough, MA (US); Rex Petersen, Fort Collins, CO (US); Robert Rose, Hudson, MA (US); Sean Welch, Bellingham, MA (US)

(73) Assignee: Intel Corporation, Santa Clara, CA (US)

( * ) Notice: Subject to any disclaimer, the term of this patent is extended or adjusted under 35 U.S.C. 154(b) by 620 days.

(21) Appl. No.: 12/566,956

(22) Filed: Sep. 25, 2009

(65) Prior Publication Data

US 2011/0074398 A1    Mar. 31, 2011

(51) Int. Cl.
G01R 19/14    (2006.01)
G01R 31/3187    (2006.01)
(52) U.S. Cl. .................................. 324/133; 324/750.3
(58) Field of Classification Search .................. None
See application file for complete search history.

(56) References Cited

U.S. PATENT DOCUMENTS

| 6,160,755 | A * | 12/2000 | Norman et al. | 365/233.15 |
| 6,668,346 | B1 * | 12/2003 | Schulz et al. | 714/724 |
| 6,882,238 | B2 * | 4/2005 | Kurd et al. | 331/186 |
| 7,133,751 | B2 * | 11/2006 | Kurd et al. | 700/293 |
| 7,138,816 | B2 * | 11/2006 | Liu | 324/750.02 |
| 7,646,208 | B2 * | 1/2010 | Ferraiolo et al. | 324/764.01 |
| 7,898,278 | B2 * | 3/2011 | Flynn et al. | 324/764.01 |

* cited by examiner

*Primary Examiner* — Paresh Patel
(74) *Attorney, Agent, or Firm* — Garrett IP, LLC

(57) ABSTRACT

Methods and systems to detect droop events on-chip, which may include a sensor circuit located adjacent to a voltage node to convert a corresponding voltage to a digital count or value indicative of the voltage. The sensor circuit may include an n-stage ring oscillator and an asynchronous counter. The sensor circuit may include circuitry to capture and convert a phase associated with a count to a binary fractional value to increase voltage resolution. Multiple counts associated with the node may be evaluated at the node to identify minimum and maximum counts and corresponding time stamps. More complex evaluation and control circuitry may be shared amongst a plurality of sensor circuits and may include circuitry to generate and compare counts to one or more variable thresholds, circuitry to average counts over time, and memory to store state values associated with the sensors.

18 Claims, 7 Drawing Sheets

METHODS AND SYSTEMS TO DETECT VOLTAGE CHANGES WITHIN INTEGRATED CIRCUITS

BACKGROUND

Droop detectors are circuits incorporated within computer processor integrated circuit chips to detect voltage spikes caused by changes in current or di/dt events. Droop detectors are used to measure integrity of power distribution systems or to correlate errors to droop events.

Conventional droop detectors do not provide adequate voltage resolution, are not sufficiently compact to be implemented adjacent to voltage nodes to be monitored or in sufficient quantity within an integrated circuit, and/or do not provide outputs in a format that are readily useful to evaluation systems.

BRIEF DESCRIPTION OF THE DRAWINGS/FIGURES

Figure 1:
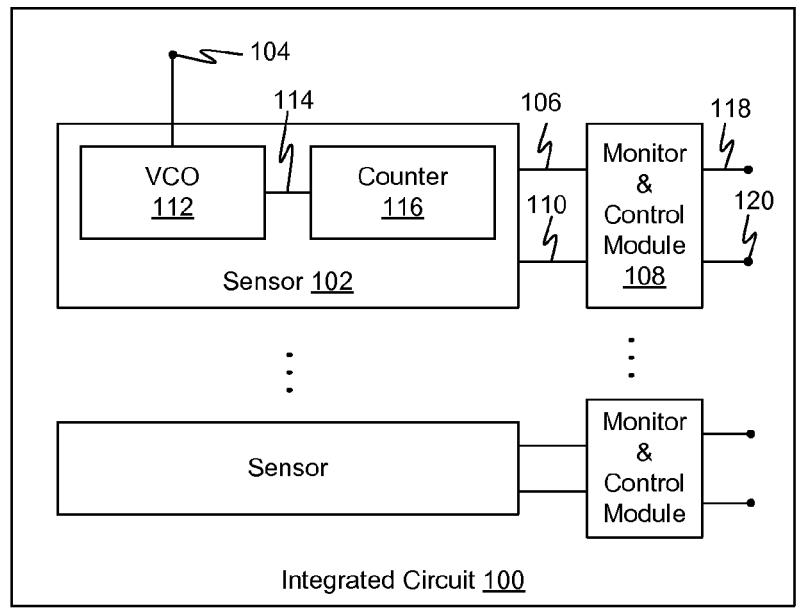
FIG. 1 is a block diagram of an exemplary integrated circuit, including an analog-to-digital converter (ADC) based sensor to convert a voltage to a digital value or count indicative of the voltage, and a monitor and control module.

In the drawings, the leftmost digit(s) of a reference number identifies the drawing in which the reference number first appears.

DETAILED DESCRIPTION

Disclosed herein are methods and systems to detect voltage changes, such as voltage spikes or droop events, within an integrated circuit. A relatively compact and voltage sensitive sensor circuit may be located adjacent to a voltage node to convert a corresponding voltage to a digital count or value indicative of the voltage. Monitor and control circuitry, or portions thereof, may be located adjacent to the sensor circuit. The monitor and control circuitry, or portions thereof, may be shared amongst multiple sensor circuits.

FIG. 1 is a block diagram of an exemplary integrated circuit (IC) 100, including an analog-to-digital converter (ADC) based sensor 102 to convert a voltage at a node 104 to a digital value or count 106 indicative of the voltage. Node 104 may correspond to a node of a system voltage grid of IC 100.

Sensor 102 may include a voltage controlled oscillator (VCO) 112 to generate an oscillating signal 114 in response to the voltage at node 104. Signal 114 may include a series of pulses having a frequency relative to the voltage at node 104. Changes in the voltage at node 104 may cause corresponding changes in the frequency of signal 114. VCO 112 may be configured to operate at a relatively high frequency, such as, for example and without limitation, approximately 20 GHz.

Sensor 102 may include relatively high speed counter 116, which may include an asynchronous or ripple counter, to count the number of times signal 114 oscillates over a measurement period.

A ripple counter may include a series of flip-flops, such as D-type flip flops, each having an inverted output node coupled to a corresponding data input node. A clock node of a first one of the flip-flops may receive oscillating signal 114. A clock node of each subsequent flip-flop may be coupled to an output of a preceding flip-flop. The data nodes of the flip-flops may correspond to count 106. Ripple counters are not, however, limited to D-type flip-flops. Other types of devices, including JK flip-flops may be used.

Since the frequency of signal 114 from VCO 112 is determined by the voltage at node 104, sensor 102 effectively operates as an ADC to convert the voltage at node 104 to a digital value or count 106.

IC 100 further includes a monitor and control module (MCM) 108 to monitor and/or evaluate count 106 and to control sensor 102 with one or more control signals 110.

MCM 108 may be configured to enable sensor 102 for fixed time measurement interval or window. Alternatively, or additional, MCM 108 may be configured to enable sensor 102 continuously.

MCM 108 may be configured to output one or more signals 118, which may include information indicative of droop events.

MCM 108 may be configured to receive one or more control signals 120, which may a signal to prompt MCM 108 to initiate a measurement window and/or to output one or more signals 110. One or more of signals 118 and 120 may correspond to a scan test signals.

Sensor 102 may be relatively small and compact, and may be implemented within IC 100 physically proximate or adjacent to node 104.

MCM 108, or a portion thereof, may be relatively small and compact, and may be implemented within IC 100 physically proximate or adjacent to sensor 102.

Alternatively, or additionally, MCM 108, or a portion thereof, may be implemented remote from sensor 102 and node 104, such as, for example, where MCM 108 or the portion thereof is shared amongst multiple sensors 102 and/or where MCM 108 or the portion thereof occupies more space than is available near node 104. Sharing of MCM 108, or portions thereof, amongst multiple sensors 102 may be useful, for example, to provide relatively complex processing functions without substantially increasing overall area requirements, and/or to implement a relatively large number of sensors 102 throughout IC 100.

Figure 2:
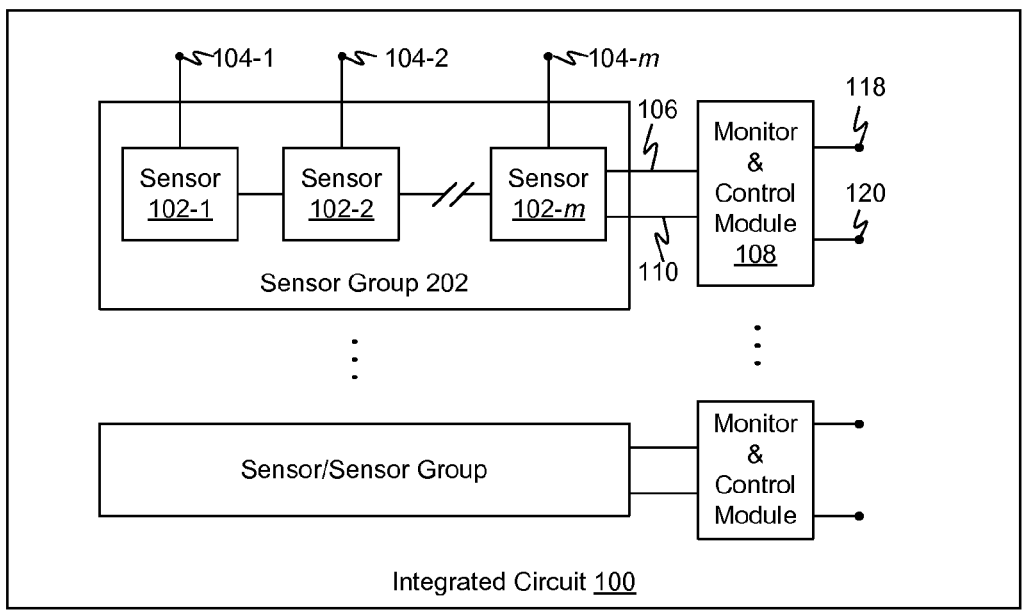
FIG. 2 is another block diagram of the integrated circuit, wherein the monitor and control module is shared amongst a plurality of sensors.

FIG. 2 is another block diagram of IC 100, wherein MCM 108 is shared amongst a plurality of sensors 102, illustrated here as a sensor group 202. In the example of FIG. 2, sensor group 202 includes sensors 102-1 through 102-m, each to convert a voltage at corresponding node 104-1 through 104-m, to a corresponding digital value, and to provide the digital value to MCM 108. Sensors 102-1 through 102-m may each be fabricated within IC 100 physically proximate to corresponding nodes 104-1 through 104-m.

Figure 3:
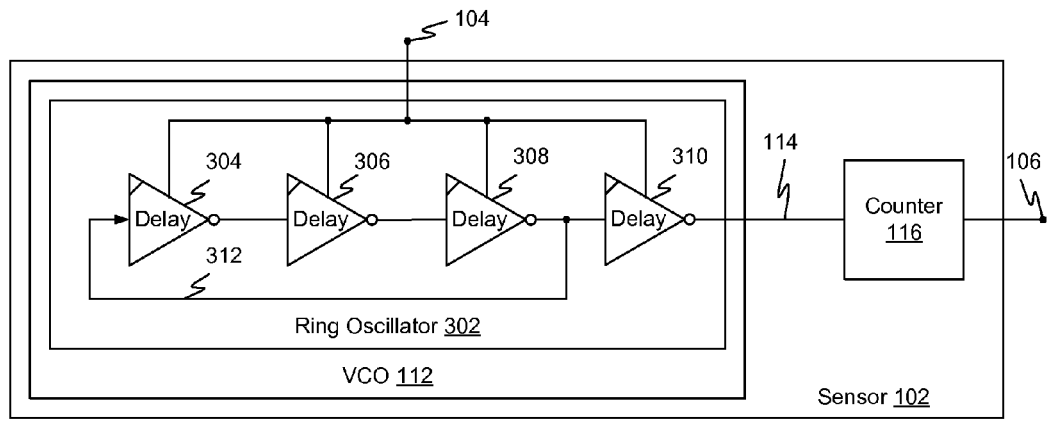
FIG. 3 is a block diagram of the sensor, including an exemplary n-stage ring oscillator.

FIG. 3 is a block diagram of sensor 102, wherein VCO 112 includes an exemplary n-stage ring oscillator 302 having a plurality of series connected inverting delay elements (inverters) 304, 306, 308, and 310. Ring oscillator 302 further includes a feedback path 312 to provide a feedback signal from an output of an odd one inverters 304 through 310, illustrated here as an output of inverter 308, to an input of inverter 304. The odd inverter feedback causes the input of inverter 304 to oscillate, which causes output 114 of VCO 112 to oscillate at a frequency that depends upon delay associated with inverters 304 through 308.

Delay associated with inverters 304 through 308 depends, at least in part on an operating voltage applied to inverters 304 through 308. In the example of FIG. 3, inverters 304 through 310 are coupled to node 104. The frequency of ring oscillator output 114 thus varies in response to changes in the voltage at node 104.

The frequency of signal 114 may be proportional to the voltage at node 104, and may increase and decrease in response to transients at node 104. Where there is little noise at node 104, corresponding counts 106 may be greater than during a droop event, or voltage drop at node 104.

Voltage resolution of sensor 102 depends, at least in part, on the number of stages within an n-stage ring oscillator, wherein fewer stages may provide greater resolution. In the example of FIG. 3, where n equals 3 (inverters 304, 306, and 308), sensor 102 may provide a relatively high frequency of operation, which may provide relatively high voltage resolution in the ADC conversion. Inverters 304, 306, and 308, may be implemented as relatively high gain delay devices, with little or no significant loss of linearity.

To minimize potential latency associated with propagation of count values to a most significant bit (MSB) latch of counter 116, counter 116 may include a sense amplifier having complementary outputs coupled to a corresponding latch input differential pair, and signal 114 may be coupled to a clock input of the sense amplifier to cause the MSB latch to toggle in response to signal 114.

Figure 4:
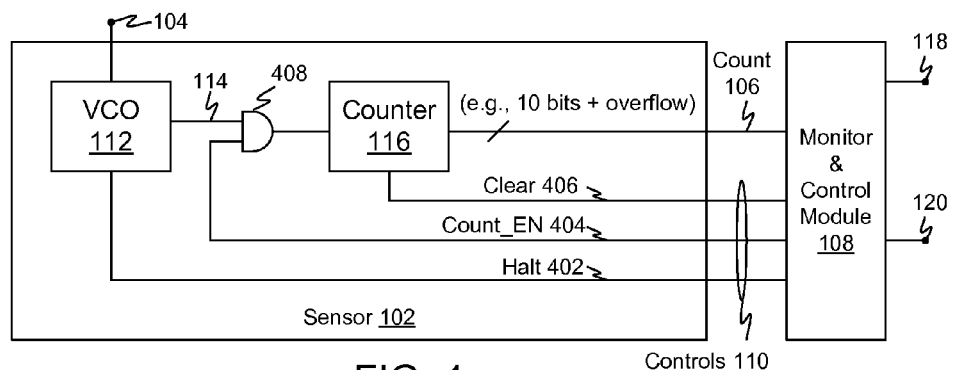
FIG. 4 is an exemplary block diagram of the monitor and control module configured to provide a halt signal, a count enable signal, and a count clear signal to the sensor.

FIG. 4 is an exemplary block diagram of sensor 102 and MCM 108, wherein MCM 108 is configured to provide a halt signal 402, a count enable signal 404, and a count clear signal 406 to sensor 102. Signals 402, 404, and 406 may correspond to control signals 110 in FIG. 1. In the example of FIG. 4, sensor 102 includes logic 408 to enable counter 116 to receive signal 114 in response to count enable signal 404.

Figure 5:
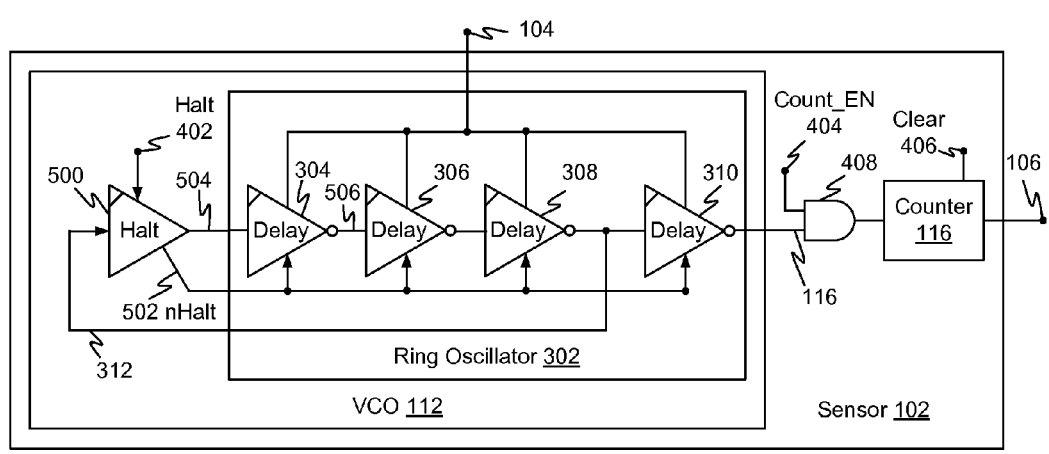
FIG. 5 is another exemplary block diagram of the sensor, including a halt element to halt the sensor.

FIG. 5 is an exemplary block diagram of sensor 102, including a halt element 500 to halt VCO 112 with an nHalt signal 502, which may correspond to an inverted version of halt signal 402. In the example of FIG. 5, feedback path 312 is provided to halt element 500, which may selectively couple feedback path 312 to a node 504 under control of halt signal 402. Node 504 serves as an input of inverter 304, which may output an inverted version of the feedback signal at an output node 506 under control of nHalt signal 502. Exemplary implementations of halt element 500 and inverter 304 are provided below with respect to FIGS. 6 and 7, respectively.

Figure 6:
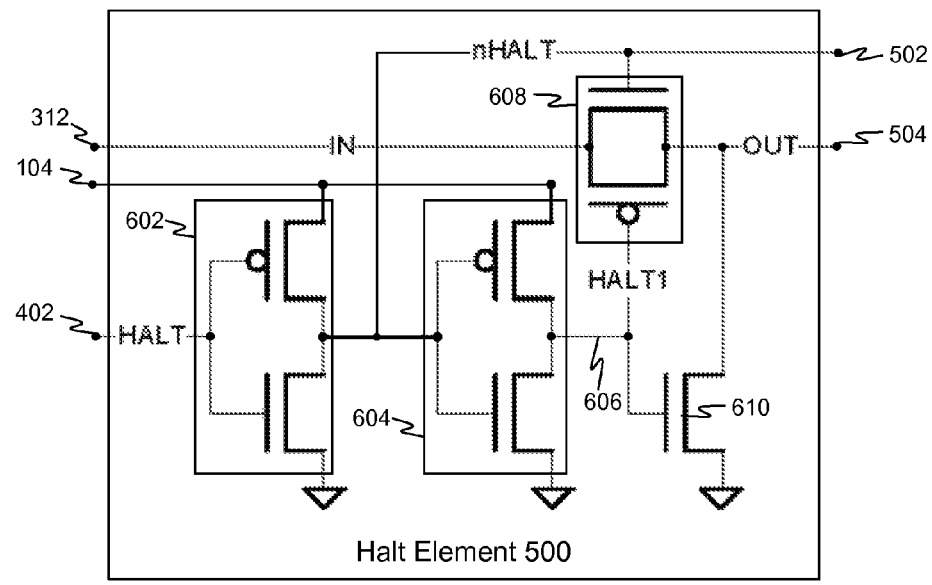
FIG. 6 is an exemplary block diagram of the halt element.

FIG. 6 is an exemplary block diagram of halt element 500, including a first inverter 602 to generate nHalt signal 502 from halt signal 402, and a second inverter 604 to generate a Haiti signal 606 from nHalt signal 502. In the example of FIG. 6, halt element 500 further includes N and P type transistors configured as a pass transistor device 608 to selectively couple feedback path 312 to output node 504 under control of nHalt signal 502 and Haiti signal, respectively. Halt element 500 further includes an N type device 610 to disable, or tie low, output node 504 under control of Haiti signal 606, when pass transistor device 608 is disabled.

Figure 7:
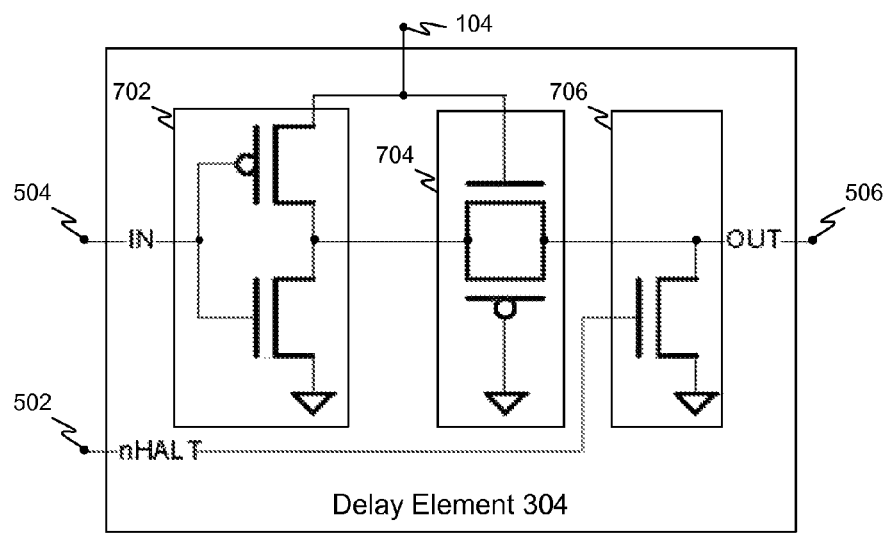
FIG. 7 is an exemplary block diagram of an inverter/delay stage within the n-stage ring oscillator.

FIG. 7 is an exemplary block diagram of inverter 304. Inverters 306, 308 and 310 may be configured similarly to inverter 304. In the example of FIG. 7, inverter 304 includes an inverter circuit 702 to invert the signal received at node 504, and a pass transistor device 704 to selectively pass the output of inverter 702 to output node 506.

Inverter circuit 702 is powered by the voltage at node 104. Similarly, an N type device of pass transistor device 704 is controlled by the monitored voltage at node 104. Delay through inverter circuit 702 and pass transistor device 704 thus vary in response to changes in the voltage at node 104, which causes frequency changes in oscillating signal 114.

Delay element 304 may further include a halt device, illustrated in FIG. 7 as an N type device 706 to disable, or tie low, output node 506 in response to nHalt signal 502.

A voltage/frequency span of sensor 102 may be adjusted or optimized with respect to a propagation time associated with a most bit (MSB) of counter 116 and a fixed-number-of-cycles latency associated with a control block.

Optimization may include selecting a longest probable measurement window, such as 32 core clock cycles at 600 MHz, for example, and determining an ADC count at multiple process, voltage, and temperature (PVT) points using a circuit simulation program. Maximum count values may be determined from frequencies measured at the multiple points, multiplied by the length of the measurement window. The maximum count values for each PVT point may be grouped by the value of the MSB for that count, since the longest propagation time for the counter is from a binary count value of 01 . . . 1 to 10 . . . 0. A counter latch may be simulated across the same or similar PVT matrix, and the slowest PVT point for each MSB case may be selected to determine a maximum counter delay for that MSB. Worst case maximum counter delay may be used to set a wait time by the control block for counter 116 to settle out.

The wait time may be translated to an operating space with respect to a core clock frequency, which may be defined as, for example, two core clock cycles to measure a droop event of 150 millivolts. At a core clock frequency of 1.5 GHz, for example, a 150 mV droop event may be measurable at system voltage Vcore $\geq$0.85V. At a core clock frequency of 2.0 GHz, however, a 150 mV droop may be need Vcore $\geq$0.95V. Dependence on clock frequency is due to the changing duration of the fixed 2-cycle wait time, wherein at higher frequencies counter 116 has less time to settle out, so it needs a higher Vcore to speed up.

A sampling window may be optimized to obtain a desired combination of voltage resolution and accuracy. A wider window may provide a greater number of counts of oscillating signal 114, since VCO 112 has more time to toggle. This may correspond to greater voltage resolution than a smaller window.

Where the count of oscillating signal 114 is averaged over the window, a wider window may provide less quantization error than a smaller window, since each count represents greater resolution and less change in voltage with each count. A smaller window may provide lower averaging error or greater accuracy.

A sample window of approximately 2 nanoseconds may provide a suitable balance between accuracy and voltage resolution, which may be in a range of approximately 10 millivolts (mV) to 25 mV. Additional resolution may be obtained by averaging repeated measurements of the voltage at node 104.

Where measurement is desired over a relatively small number of clock cycles, such as a single clock cycle, there may be a relatively limited number of counts to provide a desired voltage resolution. For example, where a clock interval is 2 Giga Hertz (GHz), and a ring oscillator is operable at 20 GHz, there may be 10 counts or transitions within oscillating signal 114 in a clock cycle.

Voltage resolution may be improved by increasing the count interval. Alternatively, or additionally, voltage resolution and time resolution may be improved by capturing phase information associated with an end of a measurement interval, such as described below with respect to FIG. 8.

Figure 8:
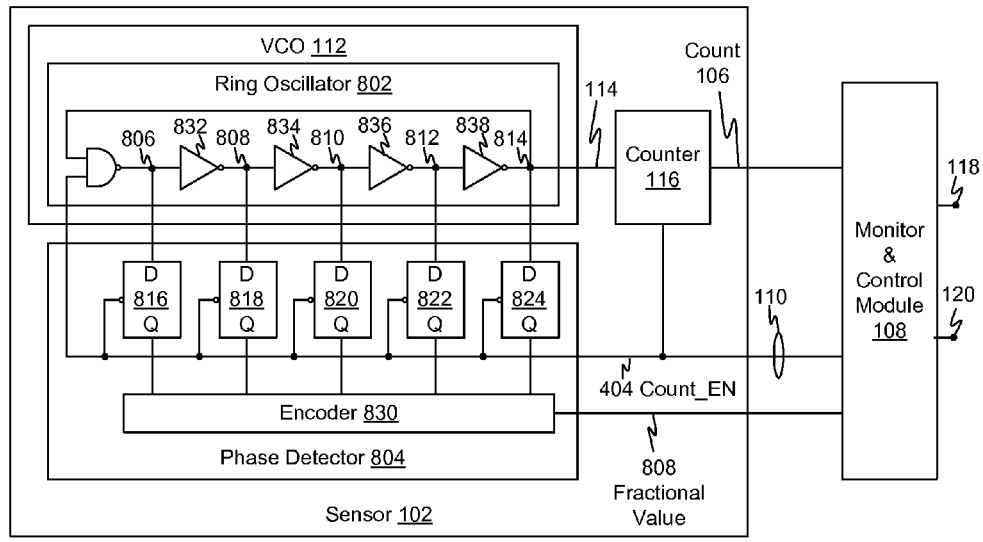
FIG. 8 is another block diagram of the sensor, including a 5-stage ring oscillator and a phase detector to output a fractional value associated a count.

FIG. 8 is an exemplary block diagram of sensor 102, wherein VCO 112 includes a 5-stage ring oscillator 802 and a phase detector 804 to output a phase or fractional value 808 upon end of a measurement interval.

Fractional value 808 may correspond to values or bits at nodes 806 through 814 of ring oscillator 802. The bits at nodes 806 through 814 correspond to a Gray code or reflected binary code, in which only one bit changes at a time. Potential error in asynchronous sampling of the phase may thus be limited to ±1 least significant bit (LSB).

Phase detector 802 may include sampling devices or latches, illustrated here as D-type flip-flops 816 through 824, to sample or capture bits at nodes 806 through 814 upon a de-assertion of count enable signal 404, which may correspond to a falling edge of count enable signal 404.

Phase detector 802 may include an encoder 830 to convert bits captured at nodes 806 through 814 to fractional values 808. Encoder 830 may be configured to convert the odd number of bits of an n-stage ring oscillator to a power of two, to provide fractional values 808 as binary values. In FIG. 8, for example, where n equals 5, nodes 806 through 814 may provide up to ten states or fractional values. Encoder 830 may be configured to map the ten states to eight states to provide three-bit fractional values. An exemplary mapping is provided in Table 1, below.

TABLE 1

| Ring Oscillator Bits (Nodes 806-814) | Binary Fraction (808) | Decimal Equivalent |
| --- | --- | --- |
| 10101 | 000 | 0 |
| 00101 | 001 | 1 |
| 01101 | 010 | 2 |
| 01001 | 010 | 2 |
| 01011 | 011 | 3 |
| 01010 | 100 | 4 |
| 11010 | 101 | 5 |
| 10010 | 110 | 6 |
| 10110 | 110 | 6 |
| 10100 | 111 | 7 |

Voltage resolution may be increased by increasing a window or time that ring oscillator 802 is enabled. The potential range of voltage resolution may be defined by a length of counter 116. Eight bits may be suitable for some applications.

Counter 116 and last-stage encoder latch 824 may be configured to see a consistent view of last-stage data at node 814. This may help to insure that accurate phase samples are obtained.

Where a rising edge of the oscillating signal 114 occurs close to a falling edge of count enable signal 404, sensor 102 may be configured to ensure that counter 116 increments only when latch 824 sees the transition of oscillating signal 114. For example, a setup time of counter 116 may be matched to that of encoder 830, such that a capture by counter 116 insures a corresponding capture by encoder 830. Alternatively, oscillating signal 114 may be provided to latch 824 prior to counter 116 to ensure that counter 116 and latch 824 see a consistent state.

Phase detector 804 may be configured such that a hold time associated with latches 816 through 824, following de-assertion of count enable signal 404, is less than a propagation time through corresponding remaining stages of ring oscillator 802. For example, a hold time associated with latch 816 may be less than a propagation time through remaining stages 832 through 838.

MCM 108 may be configured to evaluate counts 106 and/or fractional values 808 with respect to one or more of a variety of factors such as, for example and without limitation, minimum and/or maximum values and/or one or more variable thresholds.

Exemplary methods and systems to evaluate counts 106 and/or fractional values 808 are disclosed below with respect to FIGS. 9 through 15.

One or more features disclosed below with respect to FIGS. 9 through 15 may be implemented alone and/or in various combinations with one another.

One or more features disclosed below with respect to FIGS. 9 through 15 may be implemented physically proximate to an associated sensor 102 and/or remote from one or more associated sensors 102.

One or more features disclosed below with respect to FIGS. 9 through 15 may be implemented on behalf of a plurality of sensors 102, within a centralized or distributed MCM 108.

Figure 9:
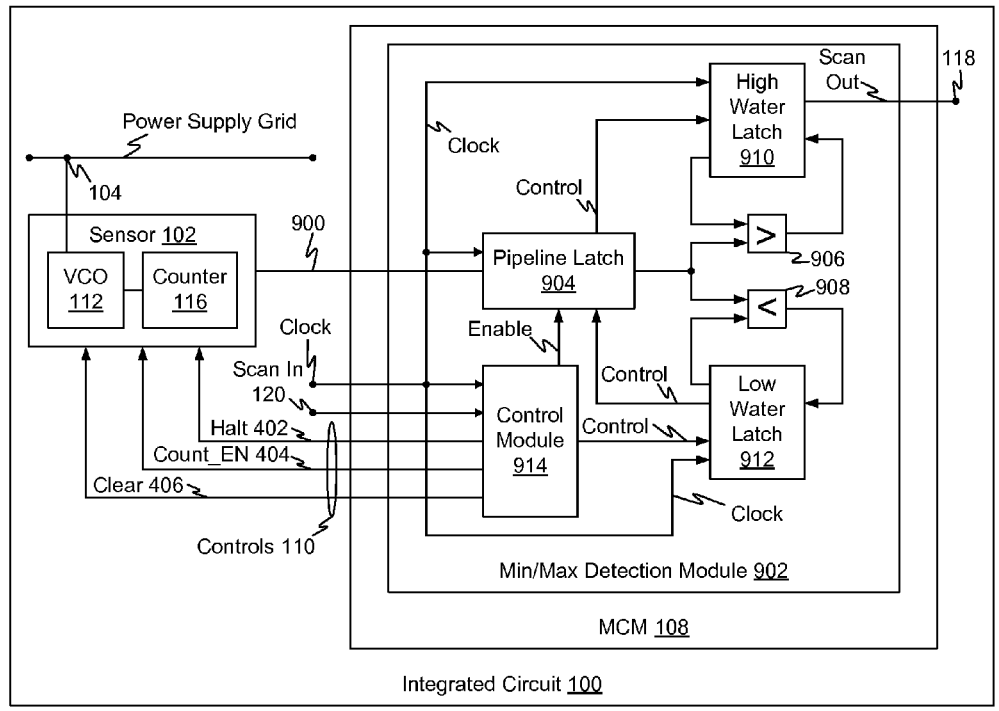
FIG. 9 is another block diagram of the integrated circuit, wherein the monitor and control module includes a min/max detection module.

FIG. 9 is a block diagram of IC 100, wherein MCM 108 includes an exemplary min/max detection module 902 to identify minimum and maximum droop events from a plurality of counts 900 received from sensor 102. Counts 900 may include one or more of counts 106 and fractional values 808.

Min/max detection module 902 may include a pipeline latch 904 to hold counts 900 after waiting a fixed number of clock cycles to allow counter 116 to settle.

Min/max detection module 902 may include a high watermark comparator 906 and a low watermark comparator 908 to compare count 900 with corresponding high and low watermarks stored within corresponding latches 910 and 912. The high and low watermarks may be updated within latches 910 and 912 upon receipt of a count 900 that exceeds a current watermark.

Min/max detection module 902 may be configured to output measurements and/or droop detector configuration data at 118. Min/max detection module 902 may be configured to output data at 118 in response to control input 120. Control input 120 and output 118 may correspond to scan signals in accordance with a scan system.

MCM 108 may be configured to output an indication at 118 when one or more droop thresholds are crossed.

Min/max detection module 902 may be configured to store and output a maximum droop measurement and overshoot values for a test case, and may be configured to store the maximum droop measurement and overshoot values for the test case in as few as 2 passes.

Min/max detection module 902 may include a control module 914 to provide control signals to one or more of pipeline latch 904, high watermark latch 910, and low watermark latch 912. Control module 914 may include a time stamp counter to associate a detected minimum and/or maximum value with a corresponding time of occurrence.

Upon an end of an analysis interval, one or more of the following data may be reported at 118:
- a minimum value and a corresponding time stamp;
- a maximum value and a corresponding time stamp; and
- a detected event value and a corresponding time stamp.

Min/max detector module 902 may be programmable to detect one or more events using one or more thresholds. An event may correspond to one or more of:
- a first event detected;
- a last event detected;
- a periodic sample; and
- an event qualified by an external condition, such as a performance monitor signal.

Min/max detection module 902 may be implemented within a relatively small area and may be dedicated to, and implemented physically proximate to a corresponding sensor 102. Alternatively, min/max detection module 902 may be shared amongst multiple sensors 102.

Exemplary methods and systems to evaluate counts 106 and/or fractional values 808 with respect one or more variable thresholds are disclosed below with respect to FIGS. 10 through 15.

A variable threshold may include one or more of:
- a dynamic threshold generated in response to previous values of count 106 and/or fractional value 808;
- a static threshold, which may be based on a programmable value or constant; and
- an adaptive threshold, such as where a dynamic threshold is locked or held at a current value in response to an event.

Figure 10:
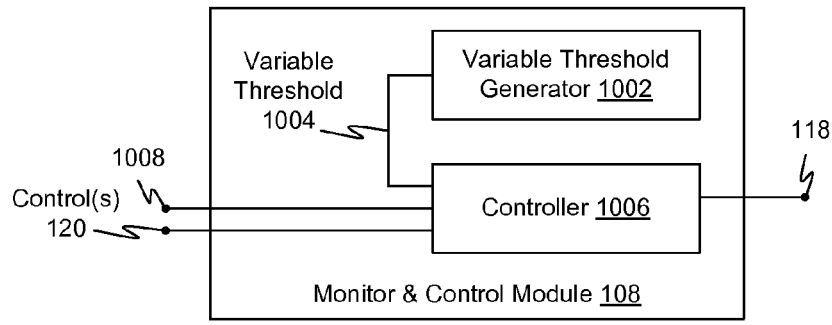
FIG. 10 is another block diagram of the monitor and control module, including a variable threshold generator.

FIG. 10 is a block diagram of MCM 108, including a variable threshold generator 1002 to generate one or more variable thresholds 1004, and a controller 1006 to evaluate counts 1008 with respect to the one or more variable thresholds 1004. Counts 1008 may include one or more of counts 106, fractional values 808, and minimum and maximum droop events identify by min/max detection module 902. Controller 1006 may include a microcontroller.

Figure 11:
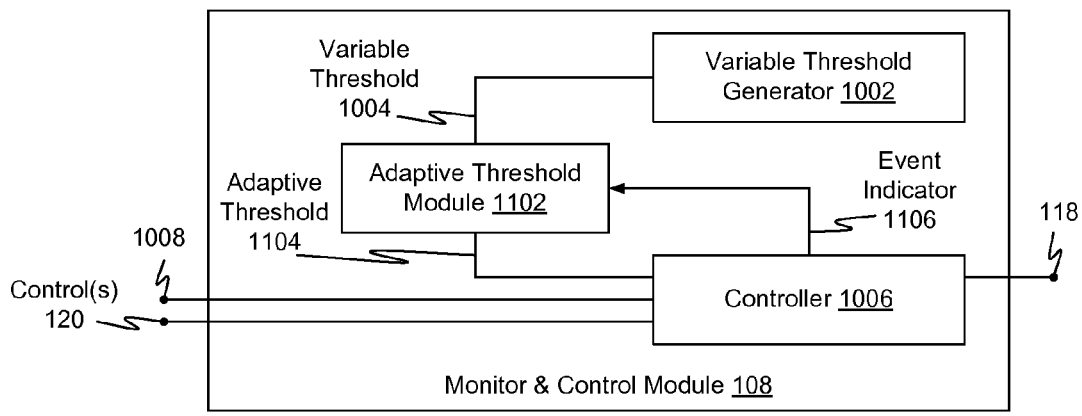
FIG. 11 is a block diagram of the monitor and control module, including an adaptive threshold module.

FIG. 11 is a block diagram of MCM 108, including variable threshold generator 1002, controller 1006, and an adaptive threshold module 1102 to output an adaptive threshold 1104 as a function of one or more variable thresholds 1004. Adaptive threshold module 1102 may be configured to output the one or more variable thresholds 1004 as adaptive threshold 1104 until an event, and to thereafter, hold adaptive threshold 1004 at the present level of the variable threshold 1004.

Figure 12:
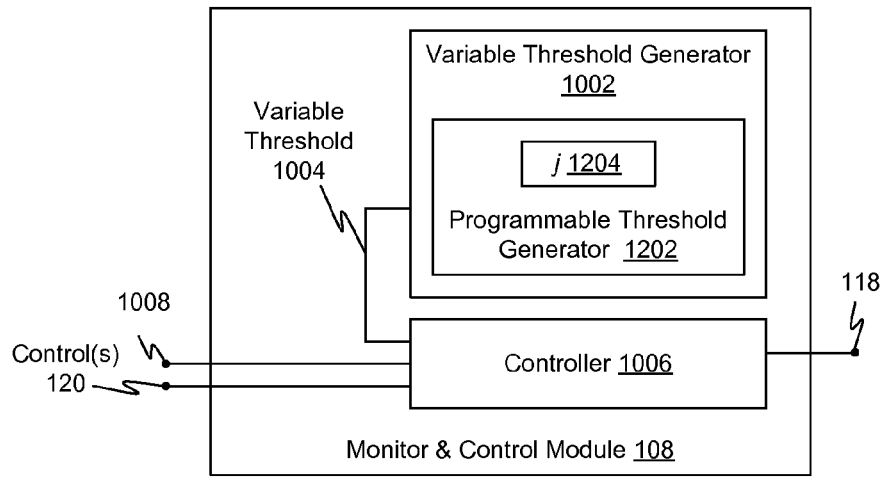
FIG. 12 is a block diagram of the monitor and control module, including a programmable threshold generator.

FIG. 12 is a block diagram of MCM 108, wherein variable threshold generator 1002 includes a programmable threshold generator 1202 to output variable threshold 1004 as a function of one or more programmable values or constants, illustrated here as j 1204.

Figure 13:
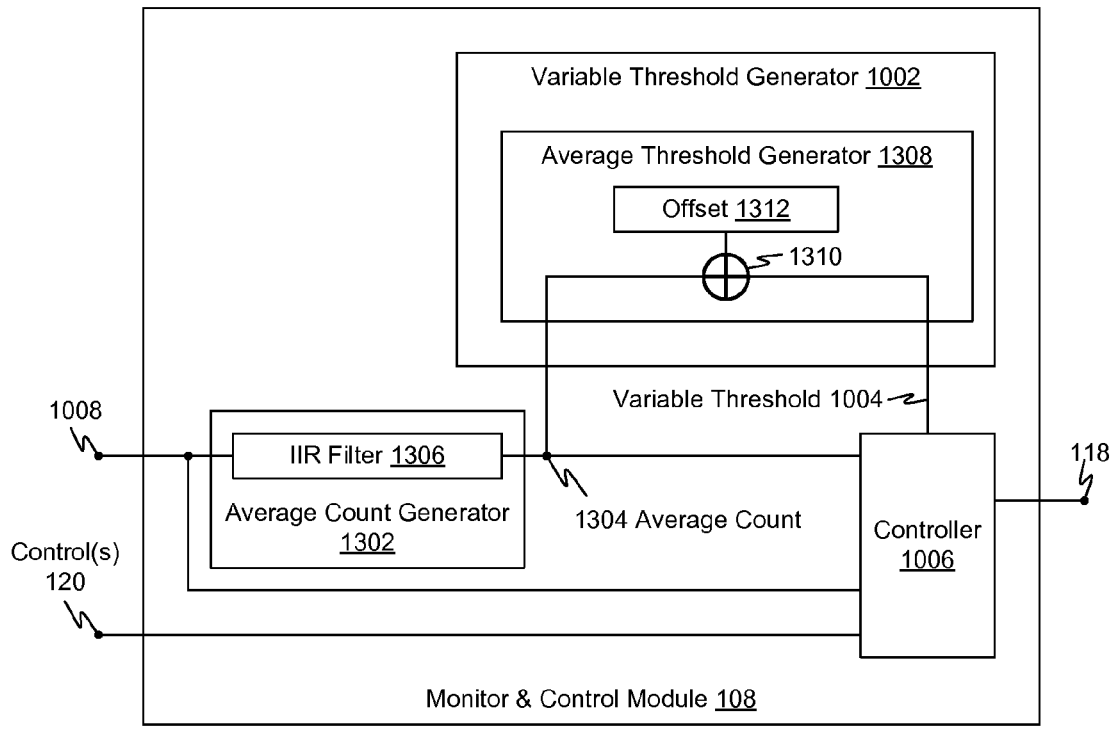
FIG. 13 is a block diagram of the monitor and control module, including an average count module, which may include an infinite impulse response (IIR) filter.
Figure 14:
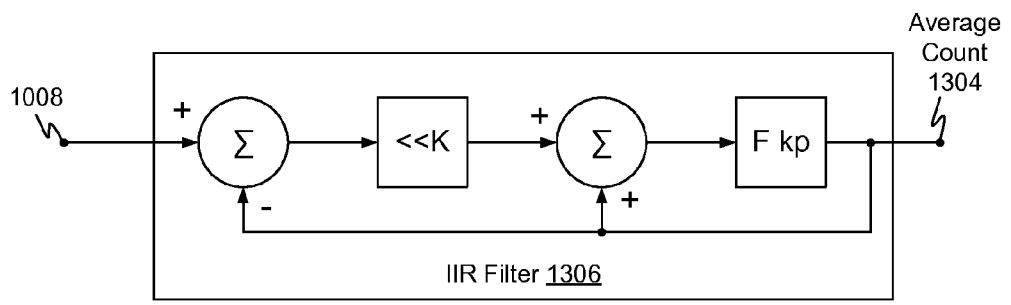
FIG. 14 is an exemplary block diagram of the IIR filter.

FIG. 13 is a block diagram of MCM 108, wherein MCM 108 includes an average count module 1302 to average counts 1008, and to generate an average count 1304. Average count module 1302 may include an infinite impulse response (IIR) filter 1306 to provide a programmable bandwidth to count average 1304. FIG. 14 is an exemplary block diagram of IIR filter 1306.

In the example of FIG. 13, variable threshold generator 1002 further includes an average count threshold generator 1308 to add an offset value 1312 to average count 1304, and to output the result as variable threshold 1004.

Controller 1006 may be configured to evaluate counts 1008 with respect to one or more variable thresholds 1004, such as disclosed above with respect to one or more of FIGS. 10 through 14 and/or with respect to min/max values generated by min/max detector module 902.

Figure 15:
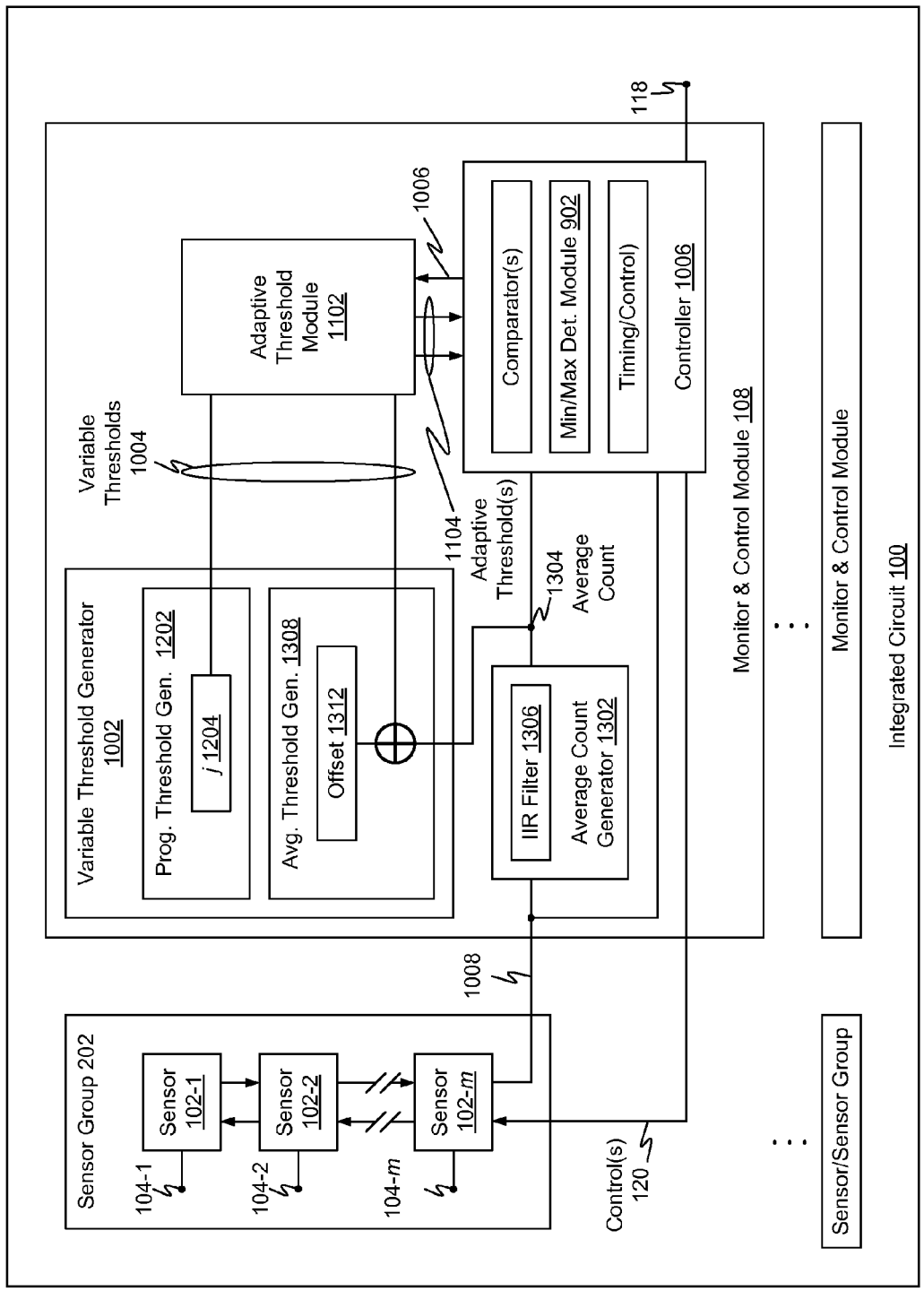
FIG. 15 is another exemplary block diagram of the integrated circuit, wherein the monitor and control module includes a combination of the programmable threshold generator, the average count generator, an average threshold generator, and the adaptive threshold module.

For example, FIG. 15 is an exemplary block diagram of IC 100, wherein MCM 108 includes programmable threshold generator 1202, average count generator 1302, average threshold generator 1308, and adaptive threshold module 1102. Alternatively, MCM 108 may include a subset of one or more the above.

Where minimum and maximum droop event detection is desired, controller 1006 may include min/max detector module 902, as illustrated in FIG. 15. Alternatively, separate instances of min/max detector modules 902 may be incorporated within one or more of sensors 102-1 through 102-*m*.

Sensors 102-1 through 102-*m* may be time multiplexed on a common bus, which may be controlled by MCM 108. The bus may include, for example, an 8 bit time shared data bus and a 1-bit serial control wire.

Bus time slots may be allocated to optimize sample rate sensor coverage. For example, time slots may be allocated to permit all of sensors 102-1 through 102-*m* to drive during a given cycle, or to permit each sensor 102-1 through 102-*m* to drive during a corresponding sensor-dedicated cycle. Alternatively, a combination of shared and dedicated time slots may be implemented.

MCM 108 may include memory or registers to store a set of state values for each sensor 102-1 through 102-*m*. IC 100 may include a debug port to permit reading and writing of the registers.

Physical space requirements of MCM 108 may approximately double with a quadrupling of supported sensors 102. For example, where four sensors 102 are supported by MCM 108, MCM 108 may occupy twice the physical space that MCM 108 would occupy where one sensor 104 is supported. Separation of MCM 108, or portions thereof, from sensor 102 may permit sensor 102 to fit in spaces that may not accommodate MCM 108 or portions thereof, and may permit a greater number of sensors within IC 100.

MCM 108 and sensor 102 may be implemented with one or more of a variety of platforms, including debug testers and systems.

MCM 108 may be configured to monitor for droops within defined time windows and/or continuously over relatively long periods of time. A defined window may be as small as a single clock cycle. Phase detector 804 may provide improved voltage resolution.

MCM 108 may be configured to monitor for droop events during debug stage, a characterization stage, and/or during normal operation of IC 100.

MCM 108 may be configured to continuously monitor for droop events during normal operation, and to output an indication in response to a droop that exceeds a threshold. This may improve system reliability. The indication may trigger remedial action.

MCM 108 may be configured to provide spatial and temporal information associated with droop events. Spatial information may be obtained by reading out droop results associated with a plurality of sensors 102, such as under control of a scan test system. Alternatively, or additionally, spatial information may be obtained independent of a scan test system, such as by enabling and disabling specific sensors 102 and observing an external trigger. This may be performed iteratively to identify a particular sensor 102 that measured a droop event. The external trigger may provide temporal information associated with droop events.

MCM 108 may be configured accumulate amplitudes of the droops over time. The droop events may be time stamped. The data may be analyzed in real time and/or stored for later use and/or analysis.

The data may be utilized to isolate failures or speed paths caused by voltage droop, to characterize a power distribution network under operational conditions, and/or to identify droop events that may not be serious enough to cause failures. Information provided by MCM 108 may be used to track a failure, including to identify an individual cycle associated with a droop event. This may reduce the number of test cycles needed to isolate a failure.

The data may be used to develop droop profiles. Droop profiles may be obtained over relatively diverse content and narrowed down to specific circuits. Changes to the circuits may be evaluated by re-running the content and observing new measurements at corresponding sensors 102. Different droop profiles may help to identify circuits that strain or tax a particular portion of a voltage grid of IC 100. Comparison between system and tester profiles may identify content flaws or discrepancies.

The data may be used to identify discrepancies between timing models and actual silicon results. For example, droop information associated with particular locations and time may be utilized to determine when an event influences performance of a particular circuit.

The data may be analyzed to determine long term voltage characteristics of IC 100, which may be used to mange power and/or to increase reliability. Power management may include optimizing an operating voltage point of IC 100 into a corresponding power envelope. Reliability gains may be obtained where a long term average operating voltage is lower than the system voltage due to droops, wherein the system voltage may be increased without risk of damage to improve reliability performance.

The data may be monitored or analyzed to obtain early indication of degradation. For example, voltage droops within IC 100 may result from capacitors on a die of IC 100 and/or capacitors associated with external pins or terminals of IC 100. Capacitors may degrade over time, which may result in increasing droop amplitudes. The increasing amplitudes may provide an early indication of capacitor degradation or failure, and may be used to initiate remedial action.

Location-specific thresholds may be determined with respect to a plurality of sensors 102, and may be used to capture a content trace. The thresholds may be based on values recording during a manufacturing test flow. The threshold levels may be programmed into fuses within IC 100, which may be scanned and provided to corresponding sensors 102 and/or MCM 108 upon power up. Corresponding voltage measurements may be compared to the thresholds continuously and/or in response to an update signal. During a debug process, the update signal may be propagated to an external pin to initiate a trace and/or to halt execution of a processor of IC 100 to permit examination of a state of corresponding content.

Sensors 102 may be calibrated to correlate or map counts 106 and/or fractional values 808 to corresponding voltage levels at node 104. Calibration may include providing multiple voltage levels at node 104, and obtaining corresponding counts 106.

Sensor 102 may have a relatively linear response when implemented in silicon, such as in accordance with a complementary metal oxide semiconductor (CMOS) technology. In such a situation, calibration may be performed with as few as two voltage level measurements, and a line may be interpolated to identify voltage levels other values of count 106.

Calibration may be performed when power supplies are relatively quiet. For example, calibration may include halting processor clocks of IC 100 and calibrating sensor 102 with a test clock. Calibration may include using a probe mode to stop instructions from executing within a processor of IC 100. Calibration may include controlling sensor 102 to take multiple measurements during a test case using a relatively wide window and averaging corresponding values.

Methods and systems are disclosed herein with the aid of functional building blocks illustrating the functions, features, and relationships thereof. At least some of the boundaries of these functional building blocks have been arbitrarily defined herein for the convenience of the description. Alternate boundaries may be defined so long as the specified functions and relationships thereof are appropriately performed.

One skilled in the art will recognize that these functional building blocks can be implemented by discrete components, application specific integrated circuits, processors executing appropriate software, and combinations thereof.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the exemplary embodiments disclosed herein.

What is claimed is:

1. A system, comprising:
   an integrated circuit including a voltage grid to provide a voltage to circuitry within the integrated circuit;
   a sensor circuit within the integrated circuit, adjacent and coupled to a node of the voltage grid, including a ring oscillator to generate a pulse stream in response to the voltage at the node and to adjust a frequency of the pulse stream in response to changes in the voltage at the node, and an asynchronous counter to count pulses of the pulse stream;
   monitor and control circuitry within the integrated circuit to enable the sensor circuit and to evaluate the count, including:
   count averaging circuitry to average the counts over time
   an average threshold generator to generate a variable threshold as a sum of a the average count and an offset value; and
   circuitry to evaluate the counts with respect to the variable threshold; and
   a plurality of additional sensor circuits within the integrated circuit, each adjacent and coupled to corresponding additional nodes, each including a corresponding ring oscillator and asynchronous counter,
   wherein at least a portion of the monitor and control circuitry is shared amongst the sensor circuits.

2. The system of claim 1, wherein:
   the sensor circuit includes latch circuitry to capture an odd number of Gray coded bits at nodes of the ring oscillator and to convert the bits to a binary fractional value; and
   the monitor and control circuitry is configured to evaluate the count and the binary fractional value.

3. The system of claim 2, wherein the monitor and control circuitry is configured to enable the sensor circuit for a single clock cycle.

4. The system of claim 3, wherein the count and fractional value provide a voltage resolution of at least 25 millivolts.

5. The system of claim 1, wherein the sensor circuit includes circuitry to enable the sensor circuit to determine a count corresponding to each of a plurality of evaluation windows, to identify minimum and maximum ones of the counts, and to associate corresponding times of occurrence with the minimum and maximum counts.

6. The system of claim 1, wherein the monitor and control circuitry is configured to selectively enable and disable individual ones of the sensor circuits.

7. The system of claim 1, wherein the monitor and control circuitry is controllable to enable the sensor circuits during evaluation windows and continuously.

8. The system of claim 1, wherein the monitor and control circuitry is configured to generate a variable threshold in response to a programmable value and to evaluate the counts with respect to variable threshold.

9. The system of claim 1, wherein the monitor and control circuitry further includes:
adaptive threshold circuitry to convert a variable threshold to a fixed threshold in response to a change in the voltage at the node representative of an event, and to compare counts subsequent to the event to the fixed threshold.

10. The system of claim 1, wherein the count averaging circuitry includes an infinite impulse response filter.

11. The system of claim 1, wherein the monitor and control circuitry include memory to store state values associated with the sensor circuits.

12. A method, comprising:
generating a pulse stream with a ring oscillator in response to a voltage at a node within an integrated circuit, including adjusting a frequency of the pulse stream in response to changes in the voltage at the node;
counting pulses of the pulse stream with an asynchronous counter circuit;
evaluating a corresponding count, including:
averaging the counts over time;
generating a variable threshold as a sum of the average count and an offset value; and
evaluating corresponding counts with respect to the variable threshold;
wherein the generating, the counting, and the evaluating are performed within the integrated circuit; and
wherein at least the generating and the counting are performed adjacent to the node; and
performing the generating and the counting with respect at a plurality of nodes within the integrated circuit using a plurality of corresponding sensor circuits adjacent to the corresponding nodes, each of the sensor circuits including a corresponding ring oscillator and asynchronous counter;
wherein at least a portion of the evaluating is performed with circuitry that is shared amongst the sensor circuits.

13. The method of claim 12, wherein:
the counting includes determining a fractional value associated with the count; and
the evaluating includes evaluating the count and the fractional value.

14. The method of claim 12, further including:
repeating the generating and the counting with respect to a plurality of evaluation windows to generate a plurality of corresponding counts;
wherein the evaluating includes identifying a minimum count and a maximum count from the counts, and associating corresponding times of occurrence with the minimum count and the maximum count; and
wherein the identifying is performed adjacent to the node.

15. An integrated circuit, comprising:
an instruction processor;
a voltage grid to provide a voltage to circuitry within the integrated circuit, including the instruction processor;
a plurality of sensor circuits, each adjacent and coupled to corresponding nodes of the voltage grid, each of the sensor circuits including a ring oscillator to generate a pulse stream in response to a voltage at the corresponding node and to adjust a frequency of the pulse stream in response to changes in the voltage at the node, each of the sensors further including an asynchronous counter to count pulses of the corresponding pulse stream; and
monitor and control circuitry to enable the sensor circuits and to receive and evaluate corresponding counts from the sensor circuits, including:
count averaging circuitry to average the counts over time;
an average threshold generator to generate a variable threshold as a sum of a the average count and an offset value; and
circuitry to evaluate the counts with respect to the variable threshold; and
a plurality of additional sensor circuits within the integrated circuit, each adjacent and coupled to corresponding additional nodes, each including a corresponding ring oscillator and asynchronous counter,
wherein at least a portion of the monitor and control circuitry is shared amongst at least a portion of the plurality of sensor circuits.

16. The system of claim 15, wherein:
at least a portion of the plurality of sensor circuits include latch circuitry to capture an odd number of Gray coded bits at nodes of the ring oscillator and to convert the bits to a binary fractional value; and
the monitor and control circuitry includes circuitry to evaluate the counts and the binary fractional values.

17. A system, comprising:
an integrated circuit including a voltage grid to provide a voltage to circuitry within the integrated circuit;
a sensor circuit within the integrated circuit, adjacent and coupled to a node of the voltage grid, including a ring oscillator to generate a pulse stream in response to the voltage at the node and to adjust a frequency of the pulse stream in response to changes in the voltage at the node, and an asynchronous counter to count pulses of the pulse stream; and
monitor and control circuitry within the integrated circuit to enable the sensor circuit and to evaluate the count, including:
count averaging circuitry to average the counts over time;
an average threshold generator to generate a variable threshold as a sum of a the average count and an offset value; and
circuitry to evaluate the counts with respect to the variable threshold.

18. A system, comprising:
an integrated circuit including a voltage grid to provide a voltage to circuitry within the integrated circuit;
a sensor circuit within the integrated circuit, adjacent and coupled to a node of the voltage grid, including a ring oscillator to generate a pulse stream in response to the voltage at the node and to adjust a frequency of the pulse stream in response to changes in the voltage at the node, and an asynchronous counter to count pulses of the pulse stream; and monitor and control circuitry within the integrated circuit to enable the sensor circuit and to evaluate the count, including
adaptive threshold circuitry to convert a variable threshold to a fixed threshold in response to a change in the voltage at the node representative of a change in the voltage at the node representative of and event, and to compare counts subsequent to the event to the fixed threshold.

* * * * *